United States Patent

Saeki et al.

[15] 3,688,199

[45] Aug. 29, 1972

[54] AUTOMATIC TUNING DEVICE FOR A BROADCAST RECEIVER

[72] Inventors: Yoshifumi Saeki, No. 19-2, 1-chome, Kita-machi, Kichijyoji, Musashino-shi, Tokyo; Seiichiro Kurihara, No. 6-4, 6-chome, Koyama, Shinagawa-ku, Tokyo, both of Japan

[22] Filed: May 13, 1970

[21] Appl. No.: 36,824

[30] Foreign Application Priority Data

May 13, 1969 Japan ......................44/36339
May 13, 1969 Japan ......................44/36340
May 13, 1969 Japan ......................44/36341
May 13, 1969 Japan ......................44/36342
May 13, 1969 Japan ......................44/36343

[52] U.S. Cl. ....................325/469, 325/471, 334/20, 334/26

[51] Int. Cl. ..............................................H04b 1/32

[58] Field of Search.............325/469, 470, 471, 464; 334/20, 18, 26

[56] References Cited

UNITED STATES PATENTS 3,189,829 6/1965 Bento et al. ...............325/470
3,467,868 9/1969 Buhr..........................325/471
3,553,379 1/1971 Boomgaard............325/471 X

*Primary Examiner*—Benedict V. Safourek
*Attorney*—Sughrue, Rothwell, Mion, Zinn and Macpeak

[57] ABSTRACT

A device for automatically tuning a channel on a broadcast receiver which has a right or left direction indicating circuit operated by closing a start push-button switch, the indicating circuit operating a differential amplifier circuit which in turn operates an electric motor which turns a variable condenser. The device further comprises a coarse tuning pulse signal generating circuit to generate a pulse signal when the condenser is near the tuning point, and a coarse tuning bistable multivibrator which is switched by a pulse signal from the coarse tuning pulse signal generating circuit to shut off the power to the right or left direction indicating circuit. When the indicating circuit is switched, a sinusoidal signal from a discriminator is applied to an input of the differential amplifying circuit. The device also has a switching circuit for de-energizing the differential amplifying circuit after the fine tuning is completed by the sinusoidal signal and for delaying for a predetermined time a further output of the coarse tuning bistable multivibrator to enable manual tuning.

5 Claims, 6 Drawing Figures

AUTOMATIC TUNING DEVICE FOR A BROADCAST RECEIVER

BACKGROUND OF THE INVENTION

1. Field of the Invention

This invention relates to a device for automatically tuning a radio frequency broadcast receiver, particularly an FM receiver.

2. Description of the Prior Art

The conventional device for automatically tuning a broadcasting receiver is a pure electronic device, a variable capacitance diode, or a variable condenser driven by an electric motor or coil spring motor. In the electronic device it is difficult to register the original tuning point upon the closure of a power switch, while in the motor device the inertia of the motor makes it difficult to select a channel.

It is therefore an object of the present invention to provide a device for automatically tuning a broadcast receiver which eliminates the aforementioned disadvantages of the conventional device and rapidly selects or tunes a channel even though it uses an electric motor for driving a variable condenser and an indicator dial. The device simultaneously provides accurate tuning with a coarse and fine tuning mechanism. The accuracy is ±20 kHz in an FM receiver.

It is another object of this invention to provide a device for automatically tuning an AM receiver with an accuracy of ±1.5 kHz.

It is a further object of the invention to provide a device for automatically tuning a receiver which will readily operate manually.

It is still another object of the invention to provide a device for automatically tuning a receiver only to stations having a stronger signal.

It is a still further object of this invention to provide remote operation of a device for automatically tuning a receiver.

It is still another object of the invention to provide a device for automatically tuning a receiver which may use a thinner cable to a remote control device.

According to one aspect of the present invention, there is provided a device for automatically tuning a receiver which comprises right or left direction indicating means operated by closing a start switch, the indicating circuit operating a differential amplifier which in turn operates an electric motor. The device further comprises a variable condenser rotated by the motor and a coarse tuning pulse signal generating means which generates a pulse signal when the variable condenser is near the tuning point. The device also has a coarse tuning bistable multivibrator means which is switched by a pulse signal from the coarse tuning pulse signal generating means and thereby shuts off the power to the right or left direction indicating means. When the indicating circuit is switched a sinusoidal signal is applied to an input of the differential amplifier. The device further comprises a switching means for de-energizing the differential amplifier after the fine tuning is completed by a sinusoidal signal and for delaying for a predetermined time a further output of the coarse tuning bistable multivibrator means to enable manual tuning. tuning.

According to another aspect of the present invention, there is provided a device for automatically tuning a receiver which comprises right or left direction indicating means operated by closing a start push-button switch, the indicating circuit operating a differential amplifier which in turn operates an electric motor which turns a variable condenser. The device also comprises a coarse tuning pulse signal generating means to generate a pulse signal when the condenser is near the tuning point, and a coarse tuning bistable multivibrator means which is switched by a pulse signal from the coarse tuning pulse signal generating means and thereby shuts off the power to the right or left direction indicating means. The cutting of power to the indicating means switches the input of the differential amplifier to a sinusoidal signal fed from a discriminator connected to an AM intermediate frequency amplifier. The device also has a switching means which operates at the zero point of the sinusoidal signal so as to the differential amplifier.

According to a further aspect of the invention, there is provided a device for automatically tuning a receiver which comprises coarse tuning bistable multivibrator means operated by closing a start push-button switch, and a time adjusting means activated upon operation of the multivibrator means such that the condenser of a time constant circuit is charged. The device further comprises a right or left direction indicating means operated by closing the start push-button switch, and a differential amplifier which becomes operative upon operation of the time adjusting means, the differential amplifier operating an electric motor in a direction indicated by the right or left direction indicating means and the motor in turn operating a tuning mechanism. The device also has a coarse tuning pulse signal generating circuit for generating a pulse signal when the tuning mechanism is near the tuning point. The device further comprises a time constant means for maintaining itself to continuously operate the differential amplifier means if the coarse tuning signal from the pulse signal generating means is applied to the coarse tuning bistable multivibrator means and for determining a time constant thereof by a zero potential of fine tuning sinusoidal signal fed from a discriminator, the time constant means simultaneously de-energizing the differential amplifier means to enable manual channel selection.

According to still another aspect of the invention, there is provided a device for automatically tuning a receiver which comprises right or left direction indicating means operated by closing a start switch, the indicating means operating a differential amplifier which in turn operates an electric motor which operates a tuning mechanism. The device further comprises a coarse tuning pulse signal generating means to generate a pulse signal when the tuning mechanism is near the tuning point. The device has an adjustable sensitivity, and contains FM stereo signal generating means for generating FM stereo signals. The device further comprises a coarse tuning bistable multivibrator means for forming a coarse tuning signal from the signal generated by the coarse tuning pulse signal generating means or the FM stereo signal generating means, the multivibrator means having a coarse tuning trigger input terminal for applying the signal thereto. The device has a first switching means for applying the coarse tuning signal to the coarse tuning trigger input terminal thereby switching the bistable multivibrator means to shut off the power of the right or left direction indicating means and a second switching means to apply a sinusoidal signal from a discriminator to the input of the differential amplifier said switching means de-energizing the differential amplifier when the sinusoidal signal is zero.

According to still another aspect of the present invention, there is provided a device for automatically tuning a receiver which comprises right or left direction indicating means operated by closing a remote start switch connected in parallel with a start switch through a diode. The indicating means operates a differential amplifier which in turn operates an electric motor. A coarse tuning pulse signal generating means generates a signal when a variable condenser rotated by the electric motor is in the area of a tuning point. The device further comprises a coarse tuning bistable multivibrator means which is switched by a pulse signal from the coarse tuning pulse signal generating means thereby shutting off the power to the right or left direction indicating means so that a sinusoidal signal is applied from a discriminator to an input of the differential amplifier. A switching means de-energizes the differential amplifier by the operation thereof at the zero potential of the sinusoidal signal.

BRIEF DESCRIPTION OF THE DRAWINGS

The other objects, features and advantages of the present invention will become apparent from the following description taken in conjunction with the accompanying drawings, in which.

DETAILED DESCRIPTION OF THE PREFERRED EMBODIMENTS

Figure 1:
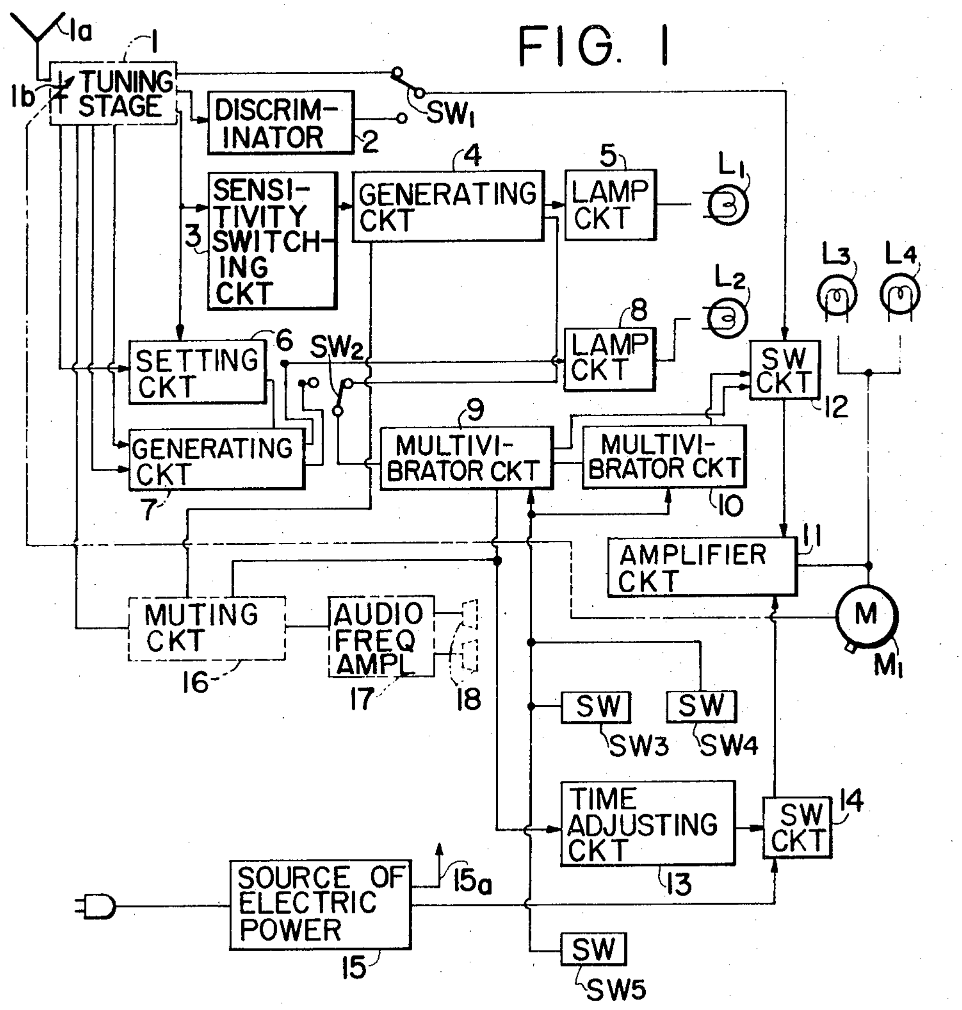
FIG. 1 is a block diagram of this invention for automatically tuning a receiver.

Reference is now to the drawings, particularly to FIG. 1, which shows a block diagram of a device for automatically tuning a receiver.

The device comprises a FM tuning stage 1 including AM and MPX stereo decoders and an antenna **1*a* and variable condenser 1*b*, and a discriminator 2 for forming an IF or intermediate frequency signal fed from the tuning stage 1. The device further comprises a sensitivity switching circuit 3 for switching between weak and strong signals, a coarse tuning pulse signal generating circuit 4 such as a Schmitt trigger for producing an output when the signal fed from the sensitivity switching circuit 3 is above a predetermined level and a lamp circuit 5 for energizing a tuning lamp LI by an output signal from the pulse signal generating circuit 4. The device contains an FM stereo channel receiving sensitivity setting circuit 6, an automatic FM stereo or monaural switching signal generating circuit 7, and a lamp circuit 8 for energizing a stereo indicator lamp L2 when the automatic FM stereo or monaural switching signal generating circuit 7** receives a stereo signal.

This device also comprises an AM or FM broadcasting channel changing switch SW1, a switch SW2 for selecting AM or FM monaural broadcasting and a start push-button switch SW3 for energizing a coarse tuning bistable multivibrator circuit 9 or a right or left travelling indicating multivibrator circuit 10.

This device further comprises a differential amplifier circuit 11, and a signal switching circuit 12 for automatically switching to a fine tuning signal from the FM tuning stage 1 from a coarse tuning signal from the coarse tuning pulse signal generating circuit 4. The device has two channel indicating lamps L3 and L4, an electric motor M for rotating a variable condenser **1*b*, a time adjusting circuit 13, and a delay switching circuit 14 for shutting off an electric current fed from a source of electric power 15 to the differential amplifier circuit 11. The delay of the switching circuit is determined by the time adjusting circuit 13. A manual tuning shaft M1 is mounted on the electric motor M and the device further contains a muting circuit 16 for controlling the output from the FM tuning stage 1, an audio-frequency amplifier 17, speakers 18, and an automatic inversion switch SW4 for the electric motor M. The source 15 has a lead 15*a*** for supplying the power to the respective circuits.

In the above device, the antenna **1*a* is connected to the FM tuning stage 1 which has a variable condenser 1*b*. The outputs of the FM tuning stage 1 are connected to one terminal of the switch SW1, to the input of the discriminator 2, the input of the sensitivity switching circuit 3, to the input of the receiving sensitivity setting circuit 6, the inputs of the signal generating circuit 7, and to the input of the muting circuit 16. The output of the discriminator 2 is connected to another terminal of the switch SW1 such that either the FM tuning stage 1 or the discriminator 2 are connected to the signal switching circuit 12 for automatically switching between the fine tuning signal feed from the FM tuning stage 1 and coarse tuning signal from the coarse tuning pulse signal generating circuit 4. The output of the sensitivity switching circuit 3 is connected to the input of the coarse tuning pulse signal generating circuit 4 for switching between weak and strong signals of AM or FM broadcasting stations such that the pulse signal generating circuit 4 produces an output when the signal fed from the sensitivity switching circuit is above a predetermined level. The outputs of the coarse tuning pulse signal generating circuit 4 are connected to the input of the lamp circuit 5 for energizing the tuning lamp L1 and to the input of the coarse tuning bistable multivibrator circuit 9 through the switch SW2. The output of the FM stereo channel receiving sensitivity setting circuit 6 is connected to automatic FM stereo or monaural switching signal generating circuit 7. The outputs of signal generating circuit 7 are connected to the input of the lamp circuit 8 for energizing the stereo indicator lamp L2 when the signal generating circuit 7 receives a stereo signal, and to the input of the coarse tuning bistable multivibrator circuit 9 through the switch SW2. The outputs of the coarse tuning bistable multivibrator circuit 9 are connected to the signal switching circuit 12 for automatically switching to the fine tuning signal fed from the FM tuning stage 1 through the discriminator 2 and switch SW1, from the coarse tuning signal fed from the coarse tuning pulse signal generating circuit 4 through the switch SW2 and coarse tuning bistable multivibrator circuit 9**. The switch SW3 is connected to the coarse tuning bistable multivibrator circuit 9 and right or left travelling indicating circuit 10 for energizing either circuit. The differential amplifier circuit 11 is connected to the channel indicating lamps L3 and L4, and the electric motor M which rotates the variable condenser 1*b*. The differential amplifier is also connected to the time adjusting circuit 13 through the delay switching circuit 14 for shutting off an electric current fed from the source 15 to the differential amplifier circuit 11 after a predetermined delay by the time adjusting circuit 13. The time adjusting circuit 13 is also connected to the coarse tuning bistable multivibrator circuit 9. The outputs of the muting circuit 16 are connected to the coarse tuning pulse signal generating circuit 4, the coarse tuning bistable multivibrator circuit 9, and to the input of the audio-frequency amplifier 17 which is connected to speakers 18. The switch SW4 is connected in parallel with the switch SW3.

This device starts operating when the start pushbutton switch SW3 is switched to either side, hat is the right or left side in the drawing. The right or left travelling indicating circuit 10 and the coarse tuning pulse signal generating circuit 4 will operate so that the differential amplifier circuit 11 receives a signal through the signal switching circuit 12. Thus, the electric motor M is energized and concurrently either the channel indicating lamp L3 or L4 is energized. Then, upon operation of the motor M, the variable condenser 1*b* is rotated, and if the device receives any radio frequency signal from a certain FM broadcasting station the coarse tuning pulse signal generating circuit 4 will operate at the same time the coarse tuning bistable multivibrator circuit 9 is switched through switch SW2 and accordingly the signal switching circuit 12 is then switched to the fine tuning side, and the right or left travelling indicating circuit 10 is de-energized. Thus, the differential amplifier circuit 11 is then operated by the fine tuning signal which is sinusoidal, the amplifier circuit operating electric motor M so as to finely tune the device while time adjusting circuit 13 is operating. As soon as the receiver is finely tuned, the time adjusting circuit 13 is de-energized to complete the tuning operation. Since the current to the motor M is shut off, the variable condenser 1*b* may then be manually rotated.

Figure 2:
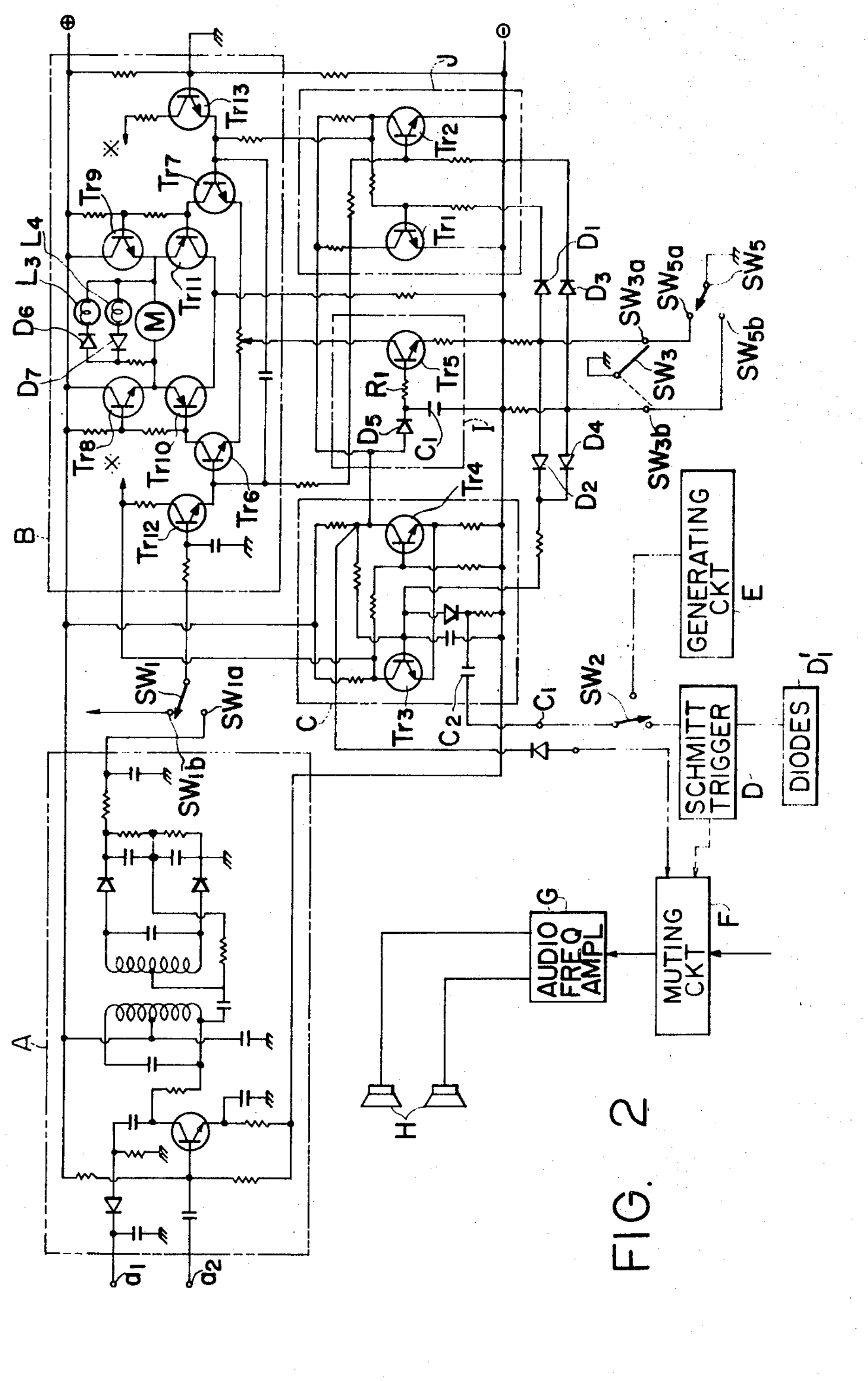
FIG. 2 is a schematic wiring diagram of the device of this invention showing main parts thereof.

Referring now to FIG. 2, which is a schematic or wiring diagram of the device of this invention, the device comprises a conventional discriminator A which is connected at the input to the trigger output terminal $a_1$ of an AM signal and to terminal $a_2$ of an intermediate-frequency amplifier (not shown). The output is connected to the fixed contact SW1*a* of the AM or FM broadcasting channel changing switch SW1. The fixed contact SW1*b* of the channel changing switch SW1 is connected to an FM discriminator (not shown). The device also comprises a differential amplifier circuit B which is connected to an electric motor M and channel indicating lamps L3 and L4 as previously described with respect to FIG. 1. In FIG. 2, the ends of leads designated by a symbol※are connected together.The device also comprises a coarse tuning bistable multivibrator circuit C which is connected at the coarse tuning trigger input terminal $c_1$ to a coarse tuning pulse signal generating circuit such as Schmitt trigger D and a stereo channel receiving switching signal generating circuit E through the switch SW2. Circuit C is also connected to a muting circuit F which is connected through an audio-frequency amplifier G to speakers H. The device further has a time adjusting circuit I which includes a time-constant circuit, a right or left direction indicating circuit J, and a start push-button switch SW3 which includes a fixed contact SW3*a* for forward biasing diodes D1 and D2 and a fixed contact SW3*b* for forward biasing diodes D3 and D4.

More particularly, the right or left direction indicating circuit J comprises transistors Tr1 and Tr2 connected as a multivibrator. The coarse tuning bistable multivibrator circuit C comprises transistors Tr3 and Tr4 connected as a multivibrator and a condenser C2 connected to the terminal $c_1$ and to the base of the transistor Tr3 through a diode. The time adjusting circuit I comprises a transistor Tr5 which is connected at its base to the output of the coarse tuning bistable multivibrator circuit C through a diode D5 and a resistor R1, the junction point between the diode D5 and the resistor R1, the junction point between the diode D5 and the resistor R1 connected through a capacitor C1 to the ground. The differential amplifier circuit B comprises transistors Tr6 through Tr13 wherein the output of the discriminator A is connected to the base of the transistor Tr12 through the switch SW1 and a coupling resistor. The emitter of the transistor Tr12 is connected to the base of the transistor Tr6 and the output of the transistor Tr1 in the right or left direction indicating circuit J is connected to the base of the transistor Tr6 and to the base of the transistor Tr7 through a resistor and a condenser. The output of the transistor Tr6 is connected to the bases of the transistors Tr8 and Tr10, and the output of the transistor Tr7 is connected to the bases of the transistors Tr9 and Tr11. The transistor Tr13 is connected at its base to ground, at the collector to the positive line and at its emitter to the base of the transistor Tr7. The output of the transistor Tr5 at its collector is connected to the emitters of the transistors Tr6 and Tr7 through a variable resistor, and the collectors of the transistors Tr10 and Tr11 are connected to the negative line through a resistor. The emitters of the transistors Tr8 and Tr10 are connected to one lead of the electric motor M and to the diodes D6 and D7 and lamps L3 and L4. The emitters of Tr8 and Tr10 are also connected to the emitters of the transistors Tr9 and Tr11, as shown in the drawing.

Figure 3A:
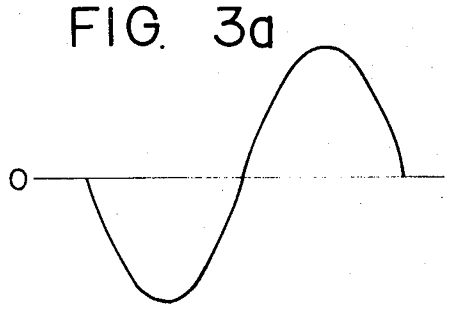
FIGS. 3*a* and 3*b* are graphic representations of waveforms of the sinusoidal signal of the discriminator of this device.

In operation of this device, if the start push-button switch SW3 is closed to the fixed contact SW3*a*, the diodes D1 and D2 are forward biased with the result that the transistors Tr1 and Tr3 are turned on while the transistors Tr2 and Tr4 are turned off. After the transistor Tr4 is turned off the diode D5 is forward biased so that the condenser C1 is charged, and the transistor Tr5 is turned on. Then, if the transistor Tr5 is turned on, the transistors Tr6 through Tr11 are connected to the negative side of the source of power and thereby become operative. In such a state, since the base voltage of the transistor Tr7 is higher than the base of the transistor Tr6, the transistor Tr7 becomes conductive. If the transistor Tr6 becomes non-conductive, the transistor Tr8 becomes conductive and since the transistor Tr7 becomes conductive, the transistor Tr11 becomes conductive. Accordingly, since the electric current will flow from the positive terminal of the source, though the transistor Tr8, electric motor M, transistor Tr11 to the negative electrode of the source, the motor will operate to rotate a tuning mechanism such as variable condenser. At the same time the motor operates, the channel selecting indicator lamp L3 is energized through the diode D6. If the tuning mechanism is operated so that a certain radio frequency signal of an FM broadcast is received, the coarse tuning pulse generating circuit D is switched with the result that the potential of the coarse tuning trigger input terminal $c_1$ decreases abruptly and the potential at the base of the transistor Tr3 instantaneously drops through the condenser C2 so that the transistor Tr2 is turned off while the transistor Tr4 turns on. Thus, the diode D5 is reversely biased so that the transistor Tr5 stays on during the time constant period determined by the condensor C1 and resistor R1. When transistor Tr3 turns off the transistors Tr12 and Tr13 become conductive. When the AM or FM changing switch SW1 is closed at the FM side, that is to the fixed contact SW1b, a sinusoidal signal is applied from the discriminator A to the base of the transistor Tr12 as an input. However, since this signal is negative as shown in FIG. 3*a*, the transistor Tr13 gradually increases conductivity while the transistor Tr12 gradually decreases conductivity. Then, if the sinusoidal signal becomes positive, the transistor Tr12 becomes conductive while the transistor Tr13 becomes non-conductive. Accordingly, the transistor Tr6 becomes conductive while the transistor Tr7 becomes non-conductive with the result that the transistors Tr9 and Tr10 become non-conductive and conductive respectively. Thus, the electric motor M rotates reversely and the channel selecting indicator lamp L4 is energized through the diode D7. The motor will stop at the zero point of the center of the sinusoidal signal. Thereafter, the transistor Tr5 stays on for a time determined by the time constant circuit of the condenser C1 and resistor R1.

Figure 3B:
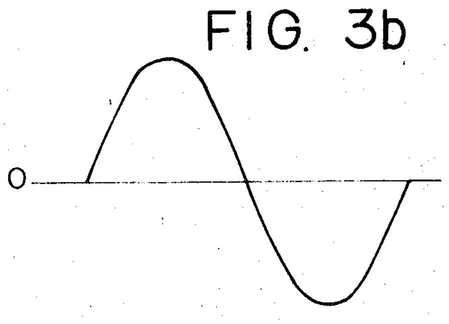

If the start switch SW3 is closed at the fixed contact SW3*b*, the transistors Tr2 and Tr3 are turned on through the diodes D3 and D4, the transistor Tr5 is turned on after the condenser C1 is charged. When the transistor Tr2 turns on, the transistors Tr6, Tr9 and Tr10 become conductive so that the electric motor M operates rotating a turning mechanism such as variable condenser. The channel selecting indicator lamp L4 is energized through the diode D7. Then, the coarse tuning pulse signal generating circuit D operates so that if the potential of the coarse tuning input terminal $c_1$ drops, the transistor Tr3 turns off while the transistor Tr4 turns on. At the same time, the transistor Tr13 becomes conductive. Since the base current to the transistor Tr5 is stopped, the transistor Tr5 is held on by condenser C1. The transistor Tr12 becomes conductive by the sinusoidal signal shown in FIG. 3*b* and when the signal becomes negative, the transistor Tr12 becomes non-conductive with the result that the transistors Tr7, Tr8 and Tr11 become conductive so that the electric motor M is reversely rotated, whereupon, the channel selecting indicating lamp L3 becomes conductive through the diode D6. Then, after the transistor Tr5 turns off, the tuning operation is completed.

If a switch is provided in parallel with the start push-button switch SW3 not shown in the drawing, it may be remotely controlled or operated.

Referring back to FIG. 2, the device may comprise a local or distant sensitivity switching circuit D1′ for changing the operating point of the pulse signal generating circuit D.

If the sensitivity switching circuit D1′ is operated to change the operating point of the coarse tuning pulse signal generating circuit D, a pulse signal is prohibited when a weak signal is received. And, since an FM stereo signal is only applied to the coarse tuning bistable multivibrator circuit C as an input by switching the switch SW2 opposite to the position shown in the drawing, only the stereo broadcasting may be tuned. The coarse tuning bistable multivibrator circuit C may be switched by the signal from the coarse tuning pulse signal generating circuit D or stereo signal generating circuit E.

The device may comprise a remote operating start push-button switch SW5. This switch SW5 may be operated instead of the switch SW3; that is, instead of closing the switch SW3 at the fixed contact SW3*a* or SW3*b*, the switch SW5 may be closed at the fixed contact SW5*a* or SW5*b*, respectively, in remote operation.

Since in the device of this invention an electric current flows through the diodes D1 through D4 to the coarse tuning bistable multivibrator circuit C and right or left direction indicating circuit J, mutual interference therebetween may be eliminated with the result that only three lines are needed for the remote operation. The three may be right, left and common ground. In order to avoid a number of thick shielded cables for controlling the volume, a lamp and photoconductive element such as CdS cell may be used such that the lamp intensity controls the resistance of CdS cell thereby attenuating the audio circuit.

It should be understood from the foregoing description that in this device if the start push-button is closed, the right or left direction indicating circuit is activated so that its output operates a differential amplifier which in turn operates an electric motor to rotate a variable condenser to tune a certain FM radio frequency of a broadcast receiver. A signal from a coarse tuning pulse generating circuit will coarsely tune the receiver and thereafter it is finely tuned by a sinusoidal signal. Tuning with this device is both accurate and speedy.

It should be understood that since in the device of this invention if the start bush-button switch is closed the right or left direction indicating circuit is operated so that its output operates a differential amplifier which in turn operates an electric motor which rotates a variable condenser, thereby tuning a certain AM radio frequency of the receiver. A signal from a coarse tuning pulse generating circuit such as a Schmitt trigger circuit will coarsely tune the receiver and thereafter it is finely tuned by a sinusoidal signal of an AM intermediate frequency amplifier connected to a discriminator. This device is also accurate and speedy.

This device further operates if the start push-button switch is closed so that the coarse tuning bistable multivibrator circuit is operated, thereby charging the condenser of the time constant circuit and operating the time adjusting circuit so that the differential amplifier circuit becomes conductive. The result of this is the right or left direction indicating circuit operates the electric motor. A coarse tuning signal is applied to the coarse tuning bistable multivibrator circuit with the result that if the multivibrator circuit is switched the power to the time adjusting circuit is shut off but the discharging voltage of the condenser in the time constant circuit maintains the time adjusting circuit conductive to enable the motor to rotate. The time constant of the time adjusting circuit so determined that when the potential of the sinusoidal signal from the discriminator applied to the differential amplifier circuit becomes zero, the differential amplifier circuit becomes turned off. The channel selecting accuracy is very high since the electric motor is stopped. Manual channel selection may be readily done by operating a manual tuning shaft, and unless the start push-button is operated, manual selection may be freely performed.

It should be understood that in this invention the differential amplifier circuit is operated through the right or left direction indicating circuit by closing the start push-button switch and the electric motor is thereby operated in an indicated direction to operate the tuning mechanism. A pulse signal is generated from the coarse tuning pulse signal generating circuit by the reception of a radio frequency signal thereby switching the coarse tuning bistable multivibrator circuit to operate the differential amplifier circuit with a sinusoidal signal from a discriminator. A coarse tuning trigger input terminal is provided in the coarse tuning bistable multivibrator circuit and the coarse tuning pulse signal generating circuit has a sensitivity switching circuit connected to the input terminal thereof. If the sensitivity switching circuit is adjusted it will select the operating point of the pulse signal generating circuit and the device will tune only strong signals. It follows that the weak and strong sensitivity may be switched. If the FM stereo signal generating circuit is connected to the trigger input terminal thereof, only stereo signals will be tuned by the device.

It should also be understood that in the device of this invention if a remotely operated start push-button switch is connected in parallel with the start push-button switch, the coarse tuning bistable multivibrator circuit and right or left direction indicating circuit are connected to the remote switch through the diodes from the start push-button switch. The differential amplifier circuit is operated by the right or left direction indicating circuit by closing the push-button switch or the remotely operated push-button switch and the electric motor is operated in a desired direction thereby rotating the tuning mechanism. A pulse signal is generated from the coarse tuning pulse signal generating circuit when the tuning mechanism is near the tuning point and the differential amplifier circuit is controlled by the sinusoidal signal from the discriminator to finely tune the device. The electric current flowing through the circuit in the case of the remotely operated start push-button switch is such that it flows through the diodes with the result that mutual interference thereof may be eliminated and accordingly the device may comprise only three lines, right, left and common ground. Since the current is weak, the lines may be thin and accordingly the remotely operated start push-button may readily be connected.

What is claimed is:

1. A device for automatically tuning a channel comprising:
- a variable tuning mechanism,
- a reversible motor for rotating the tuning mechanism,
- differential amplifier means, coupled to said motor, for controlling its direction of rotation,
- right or left direction indicating means, coupled to said differential amplifier, for generating right and left direction signals, said differential amplifier being responsive to the right and left direction signals,
- a coarse tuning pulse signal generator means for producing a pulse signal when the tuning mechanism is in the area of the tuning point,
- a coarse tuning bistable multivibrator means responsive to said pulse signal for deenergizing said right or left direction indicating means,
- means for producing a reference signal,
- discriminator means for generating a sinusoidal signal, said differential amplifier means being responsive to the deactivation of the right or left direction indicating means to receive said sinusoidal signal and said reference signal to fine tune the channel, and
- switching means for deenergizing said differential amplifier means after the fine tuning is completed by the sinusoidal signal, and for delaying for a predetermined time the output of the coarse tuning bistable multivibrator means to enable manual tuning.

2. A device for automatically tuning a channel comprising:
- a variable tuning mechanism,
- a reversible motor for rotating the tuning mechanism,
- a differential amplifier means coupled to said motor for controlling its direction of rotation,
- right or left direction indicating means coupled to said differential amplifier for generating right and left direction signals, said differential amplifier being responsive to the right and left direction signals,
- a coarse tuning pulse signal generating means for generating a pulse signal when the variable tuning mechanism is near the tuning point,
- a coarse tuning bistable multivibrator means responsive to said pulse signal for deactivating the right or left direction indicating means,
- an AM intermediate frequency amplifier,
- means for producing a reference potential,
- discriminator means coupled to said AM intermediate frequency amplifier means for generating a sinusoidal signal, said differential amplifier means being responsive to the deactivation of said right or left direction indicating means to cause one input of said differential amplifier means to receive said sinusoidal signal and another input to receive said reference potential, and
- a switching means operated at the zero potential of the sinusoidal signal to deenergize the differential amplifier means.

3. A device for automatically tuning a channel comprising:
- a variable tuning mechanism, a reversible motor for rotating the tuning element in either a clockwise or counterclockwise direction, a start switch, a coarse tuning bistable multivibrator means responsive to the operation of said start switch, time adjusting means including a resistance capacitance time constant circuit, said capacitance in the time constant circuit being charged in response to the operation of said multivibrator means, right or left direction indicating means for generating right and left direction signals, differential amplifier means responsive to the operation of said time adjusting means for causing said motor to rotate in a direction determined by said right or left direction indicating means, a coarse tuning pulse signal generating circuit for generating a pulse signal when said variable tuning mechanism is near the tuning point, said pulse signal switching said coarse tuning bistable multivibrator means, and time constant means responsive to the switching of said bistable multivibrator means by said pulse signal for maintaining said differential amplifier means energized for a predetermined time after said pulse signal.

4. A device for automatically tuning a channel comprising:

a variable tuning mechanism, a reversible motor for rotating the tuning mechanism in a clockwise or counterclockwise direction, a differential amplifier means for controlling the rotating direction of said motor, right or left direction indicating means for generating right and left direction signals, said right and left direction signals being applied to first and second input terminals of said differential amplifier means, a coarse tuning pulse signal generating means for generating a pulse signal when said tuning mechanism has rotated to a point in the vicinity of the tuning point, said generating means having adjustable sensitivity, FM stereo switching signal generating means for generating a switching signal in response to the receipt of FM stereo signals, a coarse tuning bistable multivibrator means responsive to said pulse signal or said switching signal from the FM stereo switching signal generating means for deactivating said right or left direction indicating means, said multivibrator including a coarse tuning trigger input terminal to receive said pulse signal or switching signal, and switching means for selectively connecting said coarse tuning trigger input terminal to said coarse tuning pulse signal generating means or said FM stereo switching signal generating means.

5. A device for automatically tuning a channel comprising:

a variable tuning mechanism, a reversible motor rotating said tuning mechanism, a differential amplifier means coupled to said motor for controlling its direction of rotation, right or left direction indicating means coupled to said differential amplifier for generating right and left direction signals, said right and left direction signals being applied respectively to first and second input terminals of said differential amplifier means, a start switch coupled to said right or left direction indicating means for energization thereof, a remote start switch connected in parallel with said start switch through a diode for energizing said right or left direction indicating means, a coarse tuning pulse signal generating means for generating a pulse signal when said tuning mechanism is near the tuning point, a coarse tuning bistable multivibrator means responsive to said pulse signal for deenergizing said right or left direction indicating means, discriminator means for generating a sinusoidal signal, means for generating a reference potential, means responsive to the deactivation of said right or left direction indicating means for coupling said first and second inputs of said differential amplifier means to said discriminator means and said source of reference potential, respectively, and a switching means for deenergizing said differential amplifier means at the zero potential of the sinusoidal signal.

* * * * *